United States Patent
Kusunoki

(10) Patent No.: US 10,259,911 B2
(45) Date of Patent: Apr. 16, 2019

(54) ADDITION CURABLE RESIN COMPOSITION AND SEMICONDUCTOR PACKAGE

(71) Applicant: Shin-Etsu Chemical Co., Ltd., Tokyo (JP)

(72) Inventor: Takayuki Kusunoki, Annaka (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 45 days.

(21) Appl. No.: 15/361,561

(22) Filed: Nov. 28, 2016

(65) Prior Publication Data

US 2017/0174844 A1 Jun. 22, 2017

(30) Foreign Application Priority Data

Dec. 22, 2015 (JP) ................................. 2015-249509

(51) Int. Cl.
| | | |
|---|---|---|
| *C08G 77/52* | (2006.01) | |
| *H01L 23/29* | (2006.01) | |
| *C09D 183/14* | (2006.01) | |
| *C08L 83/14* | (2006.01) | |
| *H01L 33/56* | (2010.01) | |
| *C08G 77/12* | (2006.01) | |
| *C08G 77/20* | (2006.01) | |

(52) U.S. Cl.
CPC ............. *C08G 77/52* (2013.01); *C08L 83/14* (2013.01); *C09D 183/14* (2013.01); *H01L 23/296* (2013.01); *H01L 33/56* (2013.01); *C08G 77/12* (2013.01); *C08G 77/20* (2013.01)

(58) Field of Classification Search
CPC ....................................................... C08G 77/52
See application file for complete search history.

(56) References Cited

U.S. PATENT DOCUMENTS

| | | | |
|---|---|---|---|
| 3,167,528 A | * | 1/1965 | Marsden ................ C08G 77/00 427/117 |
| 6,368,535 B1 | | 4/2002 | Katsoulis et al. |
| 7,176,270 B2 | | 2/2007 | Tabei |
| 7,651,887 B2 | | 1/2010 | Morita et al. |
| 2009/0236759 A1 | | 9/2009 | Kashiwagi |

FOREIGN PATENT DOCUMENTS

| | | |
|---|---|---|
| EP | 1 074 574 A1 | 2/2001 |
| JP | 2001-64393 A | 3/2001 |
| JP | 2005-133073 A | 5/2005 |
| JP | 2006-93354 A | 4/2006 |
| JP | 5136963 B2 | 2/2013 |

* cited by examiner

*Primary Examiner* — Kuo Liang Peng

(74) *Attorney, Agent, or Firm* — Birch, Stewart, Kolasch & Birch, LLP

(57) ABSTRACT

An addition curable resin composition comprising a silphenylene oligomer skeleton-bearing organosilicon compound having at least two alkenyl groups per molecule cures into a product having both a satisfactory hardness and crack resistance.

8 Claims, No Drawings

ADDITION CURABLE RESIN COMPOSITION AND SEMICONDUCTOR PACKAGE

CROSS-REFERENCE TO RELATED APPLICATION

This non-provisional application claims priority under 35 U.S.C. § 119(a) on Patent Application No. 2015-249509 filed in Japan on Dec. 22, 2015, the entire contents of which are hereby incorporated by reference.

TECHNICAL FIELD

This invention relates to an addition curable resin composition, especially comprising an organosilicon compound bearing a silphenylene oligomer skeleton within the molecule, and a semiconductor package encapsulated with the cured composition.

BACKGROUND ART

From the past, addition curable silicone resin compositions are used as encapsulant for semiconductor chips such as LED because of fast cure and heat resistance and light resistance of cured products. For example, Patent Document 1 describes an addition curable silicone resin composition which exhibits a high bond strength to LED packages of thermoplastic resins, typically PPA. Patent Document 2 describes the encapsulation of an optoelectronic chip with an addition curable silicone resin composition by compression molding.

Although addition curable silicone resin compositions are widely used as semiconductor encapsulant, their properties are still unsatisfactory. Particularly in the semiconductor encapsulant field where the encapsulating resin is stressed due to a temperature difference between the ambient environment and during current conduction, materials having crack resistance are required. Because of poor crack resistance, silicone resins are susceptible to cracking. To solve the problem, gel or rubber-like soft silicone resins are used. When semiconductor chips are encapsulated by compression molding using a compression mold or transfer mold, the gel or rubber-like silicone resins are inadequate because they are so tacky, giving rise to a stick-in-mold problem. There is a need for silicone resins which have a sufficient hardness for mold release and are yet resistant to stresses.

For imparting toughness to a cured silicone resin while maintaining hardness, an attempt to incorporate a silphenylene skeleton into a silicone resin is made in Patent Documents 3 and 4. As compared with the general method of establishing a high hardness by increasing the crosslinking density of silicone resin, this method establishes a high hardness by incorporating a silphenylene skeleton into a silicone resin to restrain motion of the polymer chain. Thus the resin has rigidity and hardness. While the method of increasing the crosslinking density generally makes the resin brittle, the method of incorporating a silphenylene skeleton is advantageous in that the resin exerts a toughness without embrittlement because the silphenylene skeleton is linear. However, the method of incorporating a silphenylene monomer into a silicone resin skeleton as described in Patent Documents 3 and 4, achieves weak binding of the molecular chain and thus fails to form a resin having a high hardness and yet satisfactory stress resistance.

CITATION LIST

Patent Document 1: JP 5136963
Patent Document 2: JP-A 2006-093354
Patent Document 3: JP-A 2001-064393 (U.S. Pat. No. 6,368,535, EP 1074574)
Patent Document 4: JP-A 2005-133073

DISCLOSURE OF INVENTION

An object of the invention is to provide an addition curable resin composition which cures into a product having a satisfactory hardness and crack resistance, and a semiconductor package encapsulated with the cured composition (or comprising a cured product of the resin composition).

The inventors have found that the above and other objects are attained by using a silphenylene oligomer skeleton-bearing organosilicon compound having at least two alkenyl groups per molecule, represented by the general formula (1):

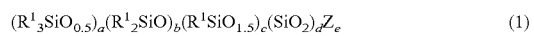

wherein $R^1$, Z, a, b, c, d, and e are as defined below. That is, an addition curable resin composition comprising the silphenylene oligomer skeleton-bearing organosilicon compound of formula (1) cures into a product having a satisfactory hardness and crack resistance.

In one aspect, the invention provides an addition curable resin composition comprising (A) a silphenylene oligomer skeleton-bearing organosilicon compound having at least two alkenyl groups per molecule, represented by the general formula (1):

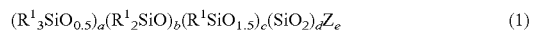

wherein $R^1$ is independently a $C_1$-$C_{12}$ monovalent hydrocarbon group free of aliphatic unsaturation or $C_2$-$C_6$ alkenyl group, at least two of $R^1$ groups per molecule being alkenyl, Z is independently a group having the formula (2):

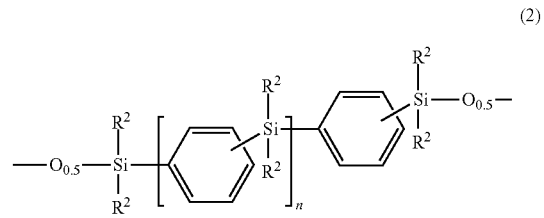

wherein $R^2$ is independently a $C_1$-$C_{12}$ monovalent hydrocarbon group, and n is an integer of 1 to 3, a is an integer of 0 to 100, b is an integer of 0 to 5,000, c is an integer of 0 to 500, d is an integer of 0 to 500, e is an integer of 1 to 500, and $2 \leq a+b+c \leq 5,000$.

In a preferred embodiment, component (A) comprises (A-i) a silphenylene oligomer skeleton-bearing branched organosilicon compound having at least two alkenyl groups per molecule, represented by formula (1) wherein b is an integer of 0 to 1,000, and $1 \leq c+d \leq 1,000$.

In another preferred embodiment, component (A) comprises (A-ii) a silphenylene oligomer skeleton-bearing linear organosilicon compound having at least two alkenyl groups per molecule, represented by the general formula (3):

wherein $R^1$ and Z are as defined above, at least two of $R^1$ groups per molecule being, alkenyl, b' is an integer of 0 to 5,000, e' is an integer of 1 to 500, and $1 \leq b'+e' \leq 5,001$.

The composition may further comprise (B) an organopolysiloxane having at least two alkenyl groups per molecule, represented by the general formula (4):

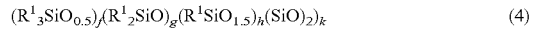

wherein $R^1$ is as defined above, at least two of $R^1$ groups per molecule being alkenyl, f is an integer of 0 to 100, g is an integer of 0 to 5,000, h is an integer of 0 to 500, k is an integer of 0 to 500, and $2 \leq f+g+h \leq 5,000$, in an amount of 5 to 500 parts by weight per 100 parts by weight of component (A) in total.

In a preferred embodiment, component (B) comprises (B-i) a branched organopolysiloxane having at least two alkenyl groups per molecule, represented by formula (4) wherein $1 \leq h+k \leq 1,000$, in an amount of 50 to 500 parts by weight per 100 parts by weight of component (A) in total.

In another preferred embodiment, component (B) comprises (B-ii) a linear organopolysiloxane having at least two alkenyl groups per molecule, represented by the general formula (5):

$$(R^1{}_3SiO_{0.5})_2(R^1{}_2SiO)_{g'} \qquad (5)$$

wherein $R^1$ is as defined above, at least two of $R^1$ groups per molecule being alkenyl, g' is an integer of 0 to 5,000, in an amount of 5 to 200 parts by weight per 100 parts by weight of component (A) in total.

The composition may further comprise (C) an organopolysiloxane having at least two hydrosilyl groups per molecule, represented by the general formula (6):

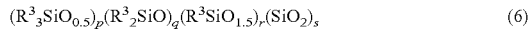
$$(R^3{}_3SiO_{0.5})_p(R^3{}_2SiO)_q(R^3SiO_{1.5})_r(SiO_2)_s \qquad (6)$$

wherein $R^3$ is independently hydrogen or a $C_1$-$C_{12}$ monovalent hydrocarbon group, at least two of $R^3$ groups per molecule being hydrogen, p is an integer of 0 to 100, q is an integer of 0 to 500, r is an integer of 0 to 300, s is an integer of 0 to 300, and $2 \leq p+q+r \leq 500$, and/or (D) a hydrosilyl-containing silphenylene compound represented by the general formula (7):

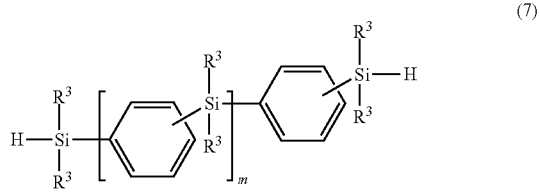

(7)

wherein $R^3$ is as defined above and m is an integer of 0 to 3, in such amounts that a ratio of the total number of hydrosilyl groups in components (C) and (D) to the total number of alkenyl groups in components (A) and (B) ranges from 0.6/1 to 3/1.

The composition may further comprise (E) a hydrosilylation catalyst.

Also contemplated herein is a semiconductor package encapsulated with a cured product of the addition curable resin composition defined above.

Advantageous Effects of Invention

The addition curable resin composition uses a silphenylene oligomer skeleton-bearing organosilicon compound having repeating silphenylene skeleton units as a base polymer. The composition has toughness because the linear molecular chain becomes rigid and is extended, as compared with the use of a silphenylene monomer skeleton bearing organosilicon compound. A cured product has both a satisfactory hardness and crack resistance.

DESCRIPTION OF PREFERRED EMBODIMENTS

The notation (Cn-Cm) means a group containing from n to m carbon atoms per group.

One embodiment of the invention is an addition curable resin composition comprising (A) a silphenylene oligomer skeleton-bearing organosilicon compound having at least two alkenyl groups per molecule, represented by the general formula (1).

(A) Silphenylene Oligomer Skeleton-Bearing Organosilicon Compound

Component (A) is a silphenylene oligomer skeleton-bearing organosilicon compound having at least two alkenyl groups per molecule, represented by the general formula (1).

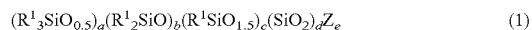
$$(R^1{}_3SiO_{0.5})_a(R^1{}_2SiO)_b(R^1SiO_{1.5})_c(SiO_2)_dZ_e \qquad (1)$$

Herein $R^1$ is independently a $C_1$-$C_{12}$ monovalent hydrocarbon group free of aliphatic unsaturation, or $C_2$-$C_6$ alkenyl group, at least two of $R^1$ groups per molecule being alkenyl. Z is independently a group having the formula (2):

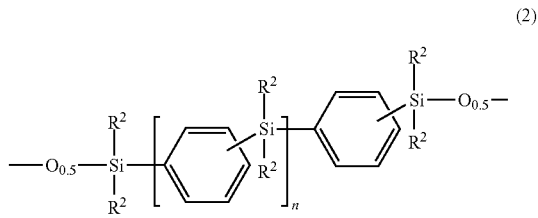

(2)

wherein $R^2$ is independently a $C_1$-$C_{12}$ monovalent hydrocarbon group, and n is an integer of 1 to 3. The subscript a is an integer of 0 to 100, b is an integer of 0 to 5,000, c is an integer of 0 to 500, d is an integer of 0 to 500, e is an integer of 1 to 500, and $2 \leq a+b+c \leq 5,000$.

In formula (1), $R^1$ is a $C_1$-$C_{12}$ monovalent hydrocarbon group free of aliphatic unsaturation, or a $C_2$-$C_6$ alkenyl group, examples of which include $C_1$-$C_{12}$ monovalent saturated aliphatic hydrocarbon groups, for example, alkyl groups such as methyl, ethyl, propyl, butyl and hexyl, and cycloalkyl groups such as cyclohexyl, $C_6$-$C_{12}$ monovalent aromatic hydrocarbon groups, for example, aryl groups such as phenyl, tolyl, xylyl and naphthyl and aralkyl groups such as benzyl, phenylethyl and phenylpropyl, and $C_2$-$C_6$ alkenyl groups such as vinyl, allyl and propenyl. At least two of $R^1$ groups are alkenyl, preferably vinyl. Methyl and phenyl are preferred as $R^1$ other than alkenyl.

The organosilicon compound should have at least two alkenyl groups per molecule. An alkenyl content is preferably 0.0001 to 1.1 mol/100 g, more preferably 0.0005 to 0.8 mol/100 g, and even more preferably 0.001 to 0.5 mol/100 g of the organosilicon compound. The alkenyl groups may be located in any of $R^1{}_3SiO_{0.5}$ units, $R^1{}_2SiO$ units and $R^1SiO_{1.5}$ units or in plural units, preferably in $R^1{}_3SiO_{0.5}$ units.

$R^2$ is a $C_1$-$C_{12}$ monovalent hydrocarbon group, examples of which include $C_1$-$C_{12}$ monovalent saturated aliphatic hydrocarbon groups, for example, alkyl groups such as methyl, ethyl, propyl, butyl and hexyl, and cycloalkyl groups such as cyclohexyl, $C_6$-$C_{12}$ monovalent aromatic hydrocarbon groups, for example, aryl groups such as phenyl, tolyl, xylyl and naphthyl and aralkyl groups such as benzyl, phenylethyl and phenylpropyl. The group $R^2$ should preferably be free of aliphatic unsaturation. Methyl and phenyl are preferred as $R^2$. The subscript n is an integer of 1 to 3, preferably 1.

In formula (1), a is an integer of 0 to 100, preferably 0 to 75, and more preferably 0 to 50; b is an integer of 0 to 5,000, preferably 0 to 1,000, more preferably 0 to 500, and even more preferably 0 to 250; c is an integer of 0 to 500, preferably 0 to 250, and more preferably 0 to 125, d is an integer of 0 to 500, preferably 0 to 250, and more preferably 0 to 125; e is an integer of 1 to 500, preferably 1 to 250, and more preferably 1 to 100; and $2 \leq a+b+c \leq 5{,}000$, preferably $2 \leq a+b+c \leq 1{,}000$, more preferably $5 \leq a+b+c \leq 750$, and even more preferably $10 \leq a+b+c \leq 500$.

The organosilicon compound may be prepared by any well-known methods. For example, it may be obtained from (co)hydrolytic condensation of a silphenylene oligomer having a hydrolyzable or hydroxyl group with a hydrolyzable silane or siloxane by a standard method. The silphenylene oligomer having a hydrolyzable or hydroxyl group is represented by the general formula (8):

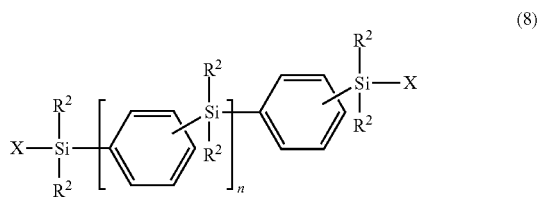

(8)

wherein $R^2$ and n are as defined above, and X is a hydrolyzable or hydroxyl group.

In formula (8), examples of the hydrolyzable group X include $C_1$-$C_{10}$ alkoxy groups such as methoxy, ethoxy, propoxy and butoxy, $C_2$-$C_{10}$ alkoxyalkoxy groups such as methoxymethoxy and methoxyethoxy, $C_1$-$C_{10}$ acyloxy groups such as acetoxy, $C_2$-$C_{10}$ alkenyloxy groups such as isopropenoxy, and halogen atoms such as chlorine, bromine and iodine. Preferably X is hydroxyl, chlorine, methoxy or ethoxy.

Examples of the silphenylene oligomer having formula (8) are given below.

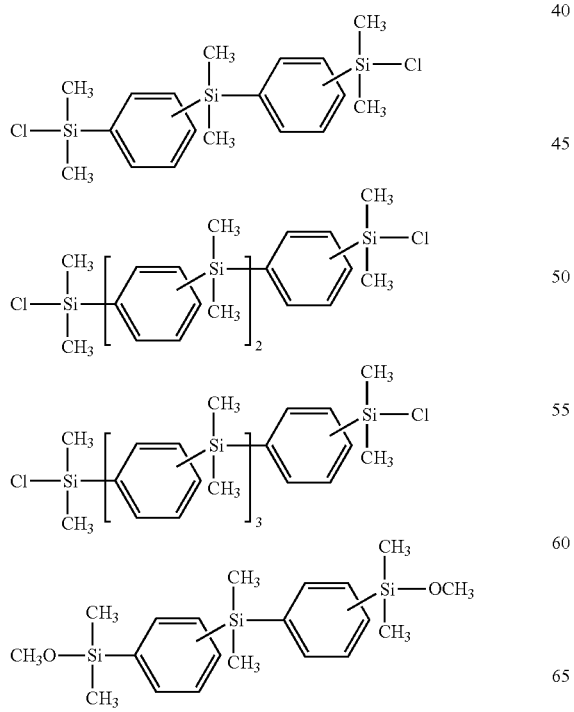

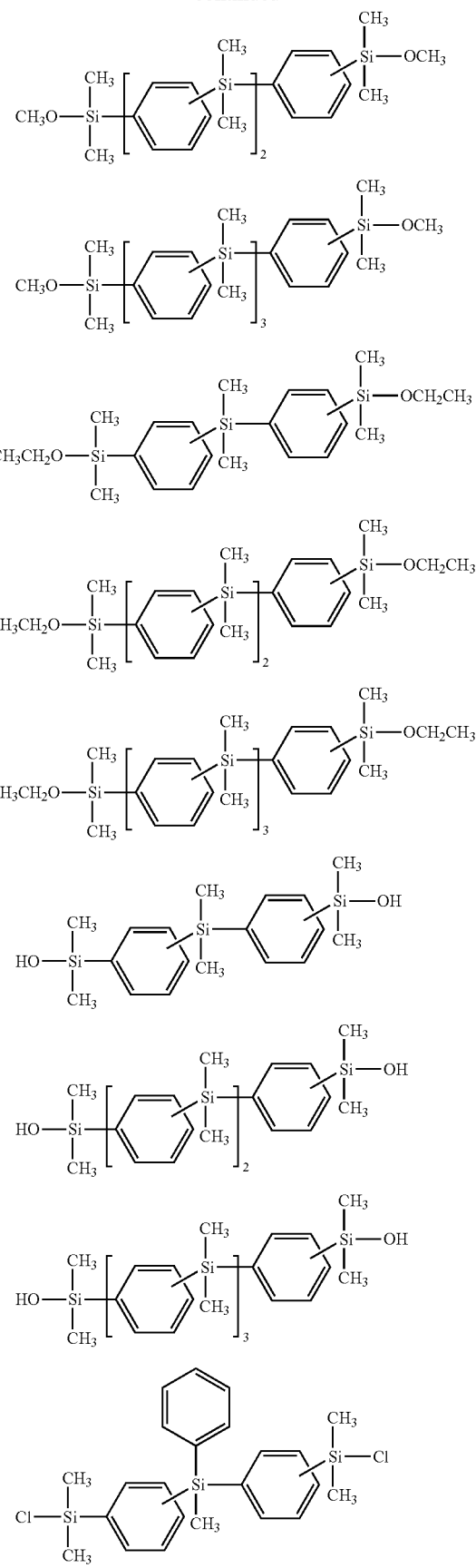

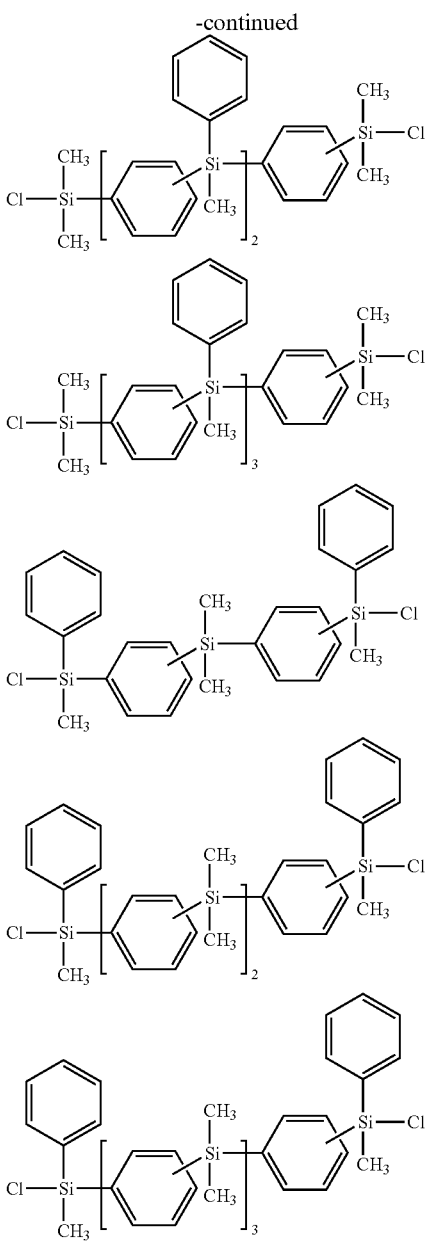

Component (A) may be used alone or in admixture of two or more. Of the silphenylene oligomer skeleton-bearing organosilicon compounds as component (A), (A-i) a branched organosilicon compound and/or (A-ii) a linear organosilicon compound is preferable.

(A-i) Silphenylene Oligomer Skeleton-Bearing Branched Organosilicon Compound Having at Least Two Alkenyl Groups Component (A-i) is a silphenylene oligomer skeleton-bearing branched organosilicon compound having at least two alkenyl groups per molecule, represented by formula (1) wherein b is an integer of 0 to 1,000, and $1 \leq c+d \leq 1{,}000$. Herein, $R^1$, Z, a, c, d, e and a+b+c are the same as defined above, and at least two of $R^1$ groups per molecule are alkenyl. The subscript b is an integer of 0 to 1,000, preferably 0 to 500, and more preferably 0 to 250, and $1 \leq c+d \leq 1{,}000$, preferably $5 \leq c+d \leq 750$, and more preferably $10 \leq c+d \leq 500$.

The organosilicon compound (A-i) should have at least two alkenyl groups per molecule. An alkenyl content is preferably 0.01 to 0.5 mol/100 g, more preferably 0.05 to 0.3 mol/100 g of the organosilicon compound. The alkenyl groups may be located in any of $R^1{}_3SiO_{0.5}$ units, $R^1{}_2SiO$ units and $R^1SiO_{1.5}$ units or in plural units, preferably in $R^1{}_3SiO_{0.5}$ units.

(A-ii) Silphenylene Oligomer Skeleton-Bearing Linear Organosilicon Compound Having at Least Two Alkenyl Groups Component (A-ii) is a silphenylene oligomer skeleton-bearing linear organosilicon compound having at least two alkenyl groups per molecule, represented by the general formula (3):

$$(R^1{}_3SiO_{0.5})_2(R^1{}_2SiO)_{b'}Z_{e'} \qquad (3)$$

wherein $R^1$ and Z are as defined above, at least two of $R^1$ groups per molecule being alkenyl, b' is an integer of 0 to 5,000, e' is an integer of 1 to 500, and $1 \leq b'+e' \leq 5{,}001$.

In formula (3), $R^1$ and Z are the same as defined above, and at least two of $R^1$ groups per molecule are alkenyl. The subscript b' is an integer of 0 to 5,000, preferably 0 to 2,500, and more preferably 0 to 1,000; e' is an integer of 1 to 500, preferably 1 to 350, and more preferably 1 to 200; and $1 \leq b'+e' \leq 5{,}001$, preferably $1 \leq b'+e' \leq 2{,}500$ and more preferably $1 \leq b'+e' \leq 1{,}000$.

The organosilicon compound (A-ii) should have at least two alkenyl groups per molecule. An alkenyl content is preferably 0.0001 to 1.1 mol/100 g, more preferably 0.0005 to 0.8 mol/100 g, and even more preferably 0.001 to 0.5 mol/100 g of the organosilicon compound. The alkenyl groups may be located in any of $R^1{}_3SiO_{0.5}$ units and $R^1{}_2SiO$ units or in plural units, preferably in $R^1{}_3SiO_{0.5}$ units.

Components (A-i) and (A-ii) may be used at the same time. When a mixture of components (A-i) and (A-ii) is used, 100 parts by weight of component (A-i) is preferably combined with 5 to 500 parts by weight, more preferably 10 to 300 parts by weight of component (A-ii).

While component (A) is essential to the inventive composition, component (B) may be optionally used in combination. Particularly when component (A) is (A-i) a branched organosilicon compound, a combination thereof with (B-ii) a linear organopolysiloxane is preferred. When component (A) is (A-ii) a linear organosilicon compound, a combination thereof with (B-i) a branched organopolysiloxane is preferred. Notably component (B) may be used alone or in admixture.

(B) Organopolysiloxane Having at Least Two Alkenyl Groups

Component (B) is an organopolysiloxane having at least two alkenyl groups per molecule, represented by the general formula (4).

$$(R^1{}_3SiO_{0.5})_f(R^1{}_2SiO)_g(R^1SiO_{1.5})_h(SiO_2)_k \qquad (4)$$

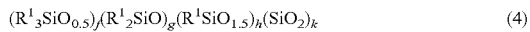

Herein $R^1$ is as defined above, at least two of $R^1$ groups per molecule being alkenyl, f is an integer of 0 to 100, g is an integer of 0 to 5,000, h is an integer of 0 to 500, k is an integer of 0 to 500, and $2 \leq f+g+h \leq 5{,}000$.

In formula (4), $R^1$ is the same as defined above, and at least two of $R^1$ groups per molecule are alkenyl. The subscript f is an integer of 0 to 100, preferably 0 to 75, and more preferably 0 to 50; g is an integer of 0 to 5,000, preferably 0 to 2,500, and more preferably 0 to 1,000; h is an integer of 0 to 500, preferably 0 to 250, and more preferably 0 to 125; k is an integer of 0 to 500, preferably 0 to 250, and more preferably 0 to 125; and $2 \leq f+g+h \leq 5{,}000$, preferably $5 \leq f+g+h \leq 2{,}500$, and more preferably $10 \leq f+g+h \leq 1{,}000$.

The organopolysiloxane (B) should have at least two alkenyl groups per molecule. An alkenyl content is preferably 0.0001 to 1.1 mol/100 g, more preferably 0.0005 to 0.5 mol/100 g, and even more preferably 0.005 to 0.3 mol/100 g of the organopolysiloxane. The alkenyl groups may be located in any of $R^1_3SiO_{0.5}$ units, $R^1_2SiO$ units and $R^1SiO_{1.5}$ units or in plural units, preferably in $R^1_3SiO_{0.5}$ units.

An amount of component (B) used is preferably 5 to 500 parts by weight, more preferably 10 to 300 parts by weight per 100 parts by weight of component (A) in total. Within the range, component (B) does not adversely affect the crack resistance improving effect of component (A).

(B-i) Branched Organopolysiloxane Having at Least Two Alkenyl Groups

Component (B-i) is a branched organopolysiloxane having at least two alkenyl groups per molecule, represented by formula (4) wherein $1 \leq h+k \leq 1{,}000$. Herein, $R^1$, f, g, h, k and $f+g+h$ are the same as defined above, and at least two of $R^1$ groups per molecule are alkenyl. The subscripts h and k meet $1 \leq h+k \leq 1{,}000$, preferably $5 \leq h+k \leq 750$, and more preferably $10 \leq h+k \leq 500$.

The organopolysiloxane (B-i) should have at least two alkenyl groups per molecule. An alkenyl content is preferably 0.01 to 0.5 mol/100 g, more preferably 0.05 to 0.3 mol/100 g of the organopolysiloxane. The alkenyl groups may be located in any of $R^1_3SiO_{0.5}$ units, $R^1_2SiO$ units and $R^1SiO_{1.5}$ units or in plural units, preferably in $R^1_3SiO_{0.5}$ units.

An amount of component (B-i) is preferably 50 to 500 parts by weight, more preferably 100 to 300 parts by weight per 100 parts by weight of component (A) in total.

(B-ii) Linear Organopolysiloxane Having at Least Two Alkenyl Groups

Component (B-ii) is a linear organopolysiloxane having at least two alkenyl groups per molecule, represented by the general formula (5):

$$(R^1_3SiO_{0.5})_2(R^1_2SiO)_{g'} \quad (5)$$

wherein $R^1$ is as defined above, at least two of $R^1$ groups per molecule being alkenyl, g' is an integer of 0 to 5,000, preferably 1 to 2,500, and more preferably 2 to 1,000.

The organopolysiloxane (B-ii) should have at least two alkenyl groups per molecule. An alkenyl content is preferably 0.0001 to 1.1 mol/100 g, more preferably 0.0005 to 0.8 mol/100 g, and even more preferably 0.001 to 0.5 mol/100 g of the organopolysiloxane. The alkenyl groups may be located in any of $R^1_3SiO_{0.5}$ units and $R^1_2SiO$ units or in plural units, preferably in $R^1_3SiO_{0.5}$ units.

An amount of component (B-ii) used is preferably 5 to 200 parts by weight, more preferably 10 to 100 parts by weight per 100 parts by weight of component (A) in total.

In the addition curable resin composition, component (C) and/or (D) is preferably used as a crosslinker.

(C) Organopolysiloxane Having at Least Two Hydrosilyl Groups

Component (C) is an organopolysiloxane having at least two hydrosilyl groups per molecule, represented by the general formula (6):

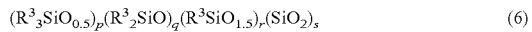

$$(R^3_3SiO_{0.5})_p(R^3_2SiO)_q(R^3SiO_{1.5})_r(SiO_2)_s \quad (6)$$

wherein $R^3$ is independently hydrogen or a $C_1$-$C_{12}$ monovalent hydrocarbon group, at least two of $R^3$ groups per molecule being hydrogen, p is an integer of 0 to 100, q is an integer of 0 to 500, r is an integer of 0 to 300, s is an integer of 0 to 300, and $2 \leq p+q+r \leq 500$.

In formula (6), $R^3$ is hydrogen or a $C_1$-$C_{12}$ monovalent hydrocarbon group, preferably free of aliphatic unsaturation. Examples of $R^3$ include hydrogen, $C_1$-$C_{12}$ monovalent saturated aliphatic hydrocarbon groups, for example, alkyl groups such as methyl, ethyl, propyl, butyl and hexyl, and cycloalkyl groups such as cyclohexyl, $C_6$-$C_{12}$ monovalent aromatic hydrocarbon groups, for example, aryl groups such as phenyl, tolyl, xylyl and naphthyl and aralkyl groups such as benzyl, phenylethyl and phenylpropyl. At least two of $R^3$ groups are hydrogen. Methyl and phenyl are preferred as $R^3$ other than hydrogen.

In formula (6), p is an integer of 0 to 100, preferably 0 to 75, and more preferably 0 to 50; q is an integer of 0 to 500, preferably 0 to 300, and more preferably 0 to 150; r is an integer of 0 to 300, preferably 0 to 200, and more preferably 0 to 100; s is an integer of 0 to 300, preferably 0 to 200, and more preferably 0 to 100; and $2 \leq p+q+r \leq 500$, preferably $2 \leq p+q+r \leq 300$, and more preferably $3 \leq p+q+r \leq 200$.

The organopolysiloxane should have at least two hydrogen atoms per molecule. A hydrogen content is preferably 0.1 to 2 mol/100 g, more preferably 0.2 to 1.8 mol/100 g of the organopolysiloxane. The hydrogen atoms may be located in any of $R^3_3SiO_{0.5}$ units, $R^3_2SiO$ units and $R^3SiO_{1.5}$ units or in plural units, preferably in $R^3_3SiO_{0.5}$ units.

Component (C) may be used alone or in admixture.

An appropriate amount of component (C) used is such that a ratio of the number of hydrosilyl groups to the total number of alkenyl groups in components (A) and (B) may range from 0.6/1 to 3/1, more preferably from 0.7/1 to 2/1, and even more preferably from 0.8/1 to 1.5/1. A ratio below the lower limit indicates shortage of SiH groups and undercure. Above the upper limit, residual SiH groups tend to induce side reactions such as dehydrogenation.

(D) Hydrosilyl-Containing Silphenylene Compound

Component (D) is a hydrosilyl-containing silphenylene compound represented by the general formula (7):

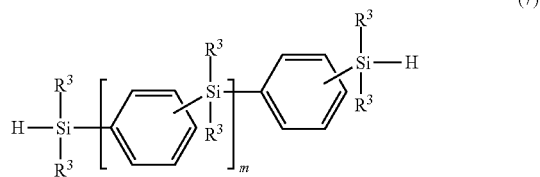

(7)

wherein $R^3$ is as defined above and m is an integer of 0 to 3.

In formula (7), $R^3$ is as defined above and m is an integer of 0 to 3, preferably 0 to 2, and most preferably 1.

Component (D) may be used alone or in admixture.

An appropriate Amount of component (D) used is such that a ratio of the number of hydrosilyl groups to the total number of alkenyl groups in components (A) and (B) may range from 0.6/1 to 3/1, more preferably from 0.7/1 to 2/1, and even more preferably from 0.8/1 to 1.5/1. A ratio below the lower limit indicates shortage of SiH groups and undercure. Above the upper limit, residual SiH groups tend to induce side reactions such as dehydrogenation.

When component (D) is used in combination with component (C), amounts of components (C) and (D) are adjusted such that a ratio of the total number of hydrosilyl groups in components (C) and (D) to the total number of alkenyl groups in components (A) and (B) may range from 0.6/1 to 3/1, more preferably from 0.7/1 to 2/1, and even more preferably from 0.8/1 to 1.5/1. Components (C) and (I)) are preferably combined in such a ratio that component (C) is 5 to 95%, more preferably 10 to 90%, and even more preferably 20 to 80% by weight based on the total weight of components (C) and (D).

(E) Hydrosilylation Catalyst

In the resin composition, (E) a hydrosilylation catalyst may be used for the purpose of promoting hydrosilylation cure. The catalyst is not particularly limited and may be selected from well-known ones. Preferred are platinum group metal elements and platinum group metal compounds. Suitable catalysts include platinum base catalysts such as platinum (inclusive of platinum black), platinum chloride, chloroplatinic acid, platinum-olefin complexes such as platinum-divinylsiloxane complex, and platinum-carbonyl complexes, palladium base catalysts and rhodium base catalysts. These catalysts may be used alone or in admixture. Inter alia, chloroplatinic acid and platinum-olefin complexes such as platinum-divinylsiloxane complex are preferred.

The amount of component (E) used is not particularly limited and may be a catalytic amount. The catalytic amount is a sufficient amount for addition reaction to take place and may be determined as appropriate in accordance with the desired cure rate. In an example where the platinum group metal catalyst is used, it is preferred from the standpoint of reaction rate that the catalyst be used in such an amount as to provide 0.1 to 50 ppm, more preferably 1 to 10 ppm of platinum group metal based on the total weight of components (A) to (D).

In addition to the above components (A) to (E), the addition curable resin composition may include optional additives such as phosphor, inorganic filler, adhesive aid, and cure inhibitor. These additives are described below.

Phosphor

The phosphor used herein is not particularly limited and any well-known phosphors may be used. One preferred example is the phosphor capable of absorbing light from a semiconductor chip, typically a semiconductor LED including a light-emissive layer of nitride semiconductor and converting it to light of different wavelength. Suitable such phosphors include nitride base phosphors and oxynitride base phosphors which are activated mainly with a lanthanoid element such as Eu or Ce; alkaline earth metal halide apatite phosphors which are activated mainly with a lanthanoid element such as Eu or a transition metal element such as Mn, alkaline earth metal borate halide phosphors, alkaline earth metal aluminate phosphors, alkaline earth metal silicate phosphors, alkaline earth metal sulfide phosphors, alkaline earth metal thiogallate phosphors, alkaline earth metal silicon nitride phosphors, and germanate phosphors; rare earth aluminate phosphors which are activated mainly with a lanthanoid element such as Ce; rare earth silicate phosphors; organic and organic complex phosphors which are activated mainly with a lanthanoid element such as Eu; and Ca—Al—Si—O—N oxynitride glass phosphors, which may be used alone or in admixture.

Exemplary of the nitride phosphors which are activated mainly with a lanthanoid element such as Eu or Ce are $M_2Si_5N_8$:Eu wherein M is at least one element selected from Sr, Ca, Ba, Mg, and Zn. Also included are $MSi_7N_{10}$:Eu, $M_{1.8}Si_5O_{0.2}N_8$:Eu, and $M_{0.9}Si_7O_{0.1}N_{10}$:Eu wherein M is at least one element selected from Sr, Ca, Ba, Mg, and Zn.

Exemplary of the oxynitride phosphors which are activated mainly with a lanthanoid element such as Eu or Ce are $MSi_2O_2N_2$:Eu wherein M is at least one element selected from Sr, Ca, Ba, Mg, and Zn.

Exemplary of the alkaline earth metal halide apatite phosphors which are activated mainly with a lanthanoid element such as Eu or a transition metal element such as Mn are $M_5(PO_4)_3X'$:R' wherein M is at least one element selected from Sr, Ca, Ba, Mg, and Zn, X' is at least one element selected from F, Cl, Br and T, and R' Is En, Mn, or Eu and Mn.

Exemplary of the alkaline earth metal borate halide phosphors are $M_2B_5O_9X'$:R' wherein M is at least one element selected from Sr, Ca, Ba, Mg, and Zn, X' is at least one element selected from F, Cl, Br and I, and R' is Eu, Mn, or Eu and Mn.

Exemplary of the alkaline earth metal aluminate phosphors are $SrAl_2O_4$:R', $Sr_4Al_{14}O_{25}$:R', $CaAl_2O_4$:R', $BaMg_2Al_{16}O_{27}$:R', $BaMg_2Al_{16}O_{12}$:R' and $BaMgAl_{10}O_{17}$:R' wherein R' is Eu, Mn, or Eu and Mn.

Exemplary of the alkaline earth metal sulfide phosphors are $La_2O_2S$:Eu, $Y_2O_2S$:Eu and $Gd_2O_2S$:Eu.

Exemplary of the rare earth aluminate phosphors which are activated mainly with a lanthanoid element such as Ce are YAG base phosphors of the compositional formulae: $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, and $(Y,Gd)_3(Al,Ga)_5O_{12}$:Ce. Also included are variants of the foregoing wherein Y is partly or entirely replaced by Tb or Lu, such as $Tb_3Al_5O_{12}$:Ce and $Lu_3Al_5O_{12}$:Ce.

Other suitable phosphors include ZnS:Eu, $Zn_2GeO_4$:Mn, and $MGa_2S_4$:Eu wherein M is at least one element selected from Sr, Ca, Ba, Mg, and Zn.

In the above phosphors, at least one element selected from Tb, Cu, Ag, Au, Cr, Nd, Dy, Co, Ni and Ti may be incorporated instead of Eu or in addition to Eu, if desired.

The Ca—Al—Si—O—N oxynitride glass phosphors are phosphors based on an oxynitride glass matrix consisting of 20 to 50 mol % of $CaCO_3$ (calculated as CaO), 0 to 30 mol % of $Al_2O_3$, 25 to 60 mol % of SiO, 5 to 50 mol % of AlN, and 0.1 to 20 mol % of a rare earth oxide or transition metal oxide, the total of five ingredients being 100 mol %. In the phosphors based on an oxynitride glass matrix, the nitrogen content is preferably up to 15 mol %, and besides the rare earth oxide ion, another rare earth ion serving as a sensitizer is preferably contained in the phosphor glass in a content of 0.1 to 10 mol % of rare earth oxide as a co-activator.

Phosphors other than the foregoing may also be used as long as they have equivalent functions and effects.

The phosphor takes the form of particles having an average particle size of preferably at least 10 nm, more preferably 10 nm to 10 μm, and even more preferably 10 nm to 1 μm. Notably, the average particle size is measured by a particle size distribution measurement system CILAS using the laser light diffraction method.

When added, the amount of the phosphor is preferably 0.1 to 2,000 parts, more preferably 0.1 to 100 parts by weight per 100 parts by weight of the other components, typically components (A) to (E) combined. When the cured product of the addition curable resin composition takes the form of a phosphor-containing film for wavelength conversion, the phosphor amount is preferably 10 to 2,000 parts by weight.

Inorganic Filler

Suitable inorganic fillers include silica, fumed silica, fumed titanium dioxide, alumina, calcium carbonate, calcium silicate, titanium dioxide, ferric oxide, and zinc oxide, which may be used alone or in admixture. When added, the amount of the filler is preferably up to 20 parts, more preferably 0.1 to 10 parts by weight per 100 parts by weight of components (A) to (E) combined, but not limited thereto.

Adhesive Aid

An adhesive aid may be added to the resin composition for imparting adhesion thereto, if desired. Suitable adhesive aids are organosiloxane oligomers of preferably 4 to 50 silicon atoms, more preferably 4 to 20 silicon atoms, having at least one substituent selected from silicon-bonded hydrogen and alkenyl and at least one of hydroxysilyl group, alkoxy group, epoxy group and nitrogen-containing substituent. These oligomers differ from components (A) to (D) in that they contain a hydroxysilyl group, alkoxy group, epoxy group or nitrogen-containing substituent.

Also useful as the adhesive aid are organooxysilyl-modified isocyanurate compounds having the formula (9) below and hydrolytic condensates thereof (i.e., organosiloxane-modified isocyanurate compounds).

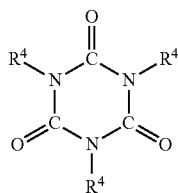
(9)

In formula (9), $R^4$ is each independently an organic group having the formula (10) below, or a monovalent unsaturated aliphatic hydrocarbon group which may contain an oxygen atom, with the proviso that at least one $R^4$ is an organic group of formula (10).

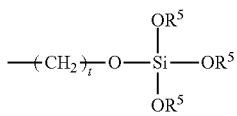
(10)

Herein $R^5$ is hydrogen or a $C_1$-$C_6$ monovalent hydrocarbon group such as methyl or ethyl, and t is an integer of 1 to 6, preferably 1 to 4.

In formula (9), the monovalent unsaturated aliphatic hydrocarbon group represented by $R^4$ may optionally contain oxygen, and is preferably selected from hydrocarbon groups of 2 to 8 carbon atoms, more preferably 2 to 6 carbon atoms, for example, linear or branched alkenyl groups such as vinyl, allyl, 1-butenyl, 1-hexenyl and 2-methylpropenyl, and (meth)acrylic groups.

When added, the amount of the adhesive aid is preferably up to 10 parts, more preferably 0.1 to 8 parts, and even more preferably 0.2 to 5 parts by weight per 100 parts by weight of components (A) to (E) combined. As long as the amount is equal to or less than the upper limit, the cured product has a high hardness and a less surface tack.

The adhesive aid is preferably added in such amounts that the ratio of the total number of hydrosilyl groups in the entire composition (inclusive of the adhesive aid) to the total number of alkenyl groups in the entire composition may range from 0.4/1 to 4/1, more preferably 0.6/1 to 3/1, and even more preferably 0.8/1 to 2/1.

Further the adhesive aid is preferably added in an amount of 0.01 to 10%, more preferably 0.1 to 5% by weight based on the total weight of components (A) to (E). This range of the adhesive aid is effective for improving the adhesion of the composition without sacrificing its benefits.

Cure Inhibitor

A cure inhibitor may be added to the resin composition for controlling reactivity to enhance shelf stability, if desired. Suitable cure inhibitors include triallyl isocyanurate, alkyl maleates, acetylene alcohols, silane or siloxane-modified products thereof, hydroperoxide, tetramethylethylenediamine, benzotriazole, and mixtures thereof. When added, the amount of the cure inhibitor is preferably 0.001 to 1 part, more preferably 0.005 to 0.5 part by weight per 100 parts by weight of components (A) to (E) combined.

Other Additives

Besides the above components, other additives may be added to the resin composition. Suitable additives include a radical scavenger, flame retardant, surfactant, photostabilizer, thickener, plasticizer, antioxidant, heat stabilizer, conductive agent, antistatic agent, radiation shielding agent, nucleating agent, phosphorus peroxide decomposing agent, lubricant, pigment, metal inactivating agent, physical property regulator, and organic solvent. These optional additives may be used alone or in admixture.

The simplest embodiment of the addition curable resin composition is a composition consisting of components (A), (C) and (E). Particularly when it is desired that a cured product have high transparency, the composition should preferably be free of an inorganic filler such as silica filler. Examples of the inorganic filler are as described above.

The method for preparing the addition curable resin composition is not particularly limited. The composition may be prepared by any prior art well-known methods, for example, by mixing components (A) to (E), and optional components in a standard way. For example, the components are fed into a commercially available mixer (e.g., Thinky Conditioning Mixer by Thinky Corp.) where they are mixed for about 1 to 5 minutes until uniform.

The method for curing the addition curable resin composition is not particularly limited. The composition may be cured by any prior art well-known methods, for example, by heating at 60 to 180° C. for about 1 to 12 hours. Preferably the composition is cured stepwise. The stepwise curing includes two steps, for example. The resin composition is heated at a temperature of 60 to 100° C. for 0.5 to 2 hours for achieving full deaeration before it is heated at a temperature of 120 to 180° C. for 1 to 10 hours for heat curing. Such stepwise curing ensures that even when the composition to be cured is thick walled, it is fully cured into a colorless transparent product without bubbles. The term "colorless transparent product" means that a cured part of 1 mm thick has a light transmittance of at least 80%, preferably at least 85%, and most preferably at least 90% at wavelength 450 nm.

Since the addition curable resin composition cures into a product having a high light transmittance, it is suited for the encapsulation of LED chips, especially blue and purple LED chips. An LED chip or microelectronic device may be encapsulated with the addition curable resin composition by any prior art well-known methods, for example, dispensing or compression molding.

Since the addition curable resin composition cures into a product having crack resistance, heat resistance, light resistance and transparency as well as an appropriate hardness, it is also suited in a variety of applications including display materials, optical recording media materials, optional equipment materials, optical part materials, optical fiber materials, optoelectronic functional organic materials, and semiconductor IC-related materials.

EXAMPLE

Examples of the invention are given below by way of illustration and not by way of limitation. In Examples, all parts are by weight (pbw) unless otherwise indicated.

Proton nuclear magnetic resonance ($^1$H-NMR) spectra were measured on a spectrometer ULTRASHIELD® 400PLUS (Bruker).

The Vi value (mol/100 g) and SiH value (mol/1.00 g) shown below were determined by measuring a $^1$H-NMR spectrum of the compound at 400 MHz, and computing integrated values of hydrogen atoms using dimethyl sulfoxide as internal standard.

Components (A) to (F) used in Examples have the following structures. Me stands for methyl, Ph for phenyl, and Vi for vinyl, and Z, Z' and Y have the following formulae.

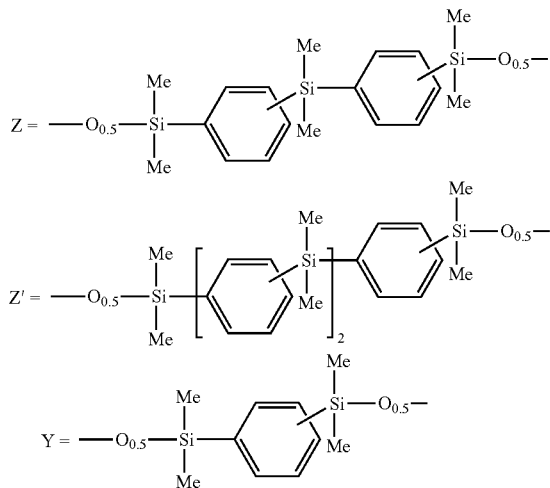

(A-1) Branched organosilicon compound of the formula below (Shin-Etsu Chemical Co., Ltd., Vi value=0.177 mol/100 g)

$(Vi(Me)_2SiO_{0.5})_3(PhSiO_{1.5})_7Z_{1.5}$ (A-2) Branched organosilicon compound of the formula below (Shin-Etsu Chemical Co., Ltd., Vi value=0.214 mol/100 g)

$(Vi(Me)_2SiO_{0.5})_{15}((Me)_3SiO_{0.5})_{15}(SiO_2)_{45}Z_5$ (A-3) Branched organosilicon compound of the formula below (Shin-Etsu Chemical Co., Ltd., Vi value=0.151 mol/100 g)

$(Vi(Me)_2SiO_{0.5})_{60}((Me)_3SiO_{0.5})_{120}(SiO)_{180}Z_{40}$ (A-4) Branched organosilicon compound of the formula below (Shin-Etsu Chemical Co., Ltd., Vi value=0.111 mol/100 g)

$((Me)_3SiO_{0.5})_{60}(ViMeSiO)_{30}(MeSiO_{1.5})_{190}Z_{20}$ (A-5) Linear organosilicon compound of the formula below (Shin-Etsu Chemical Co., Ltd., Vi value=0.379 mol/100 g)

$(Vi(Me)_2SiO_{0.5})_2Z_1$ (A-6) Linear organosilicon compound of the formula below (Shin-Etsu Chemical Co., Ltd., Vi value=0.302 mol/100 g)

$(Vi(Me)_2SiO_{0.5})_2Z'_1$ (A-7) Linear organosilicon compound of the formula below (Shin-Etsu Chemical Co., Ltd., Vi value=0.043 mol/100 g)

$(Vi(Me)_2SiO_{0.5})_2(PhMeSiO)_{28}Z_2$ (A-8) Linear organosilicon compound of the formula below (Shin-Etsu Chemical Co., Ltd., Vi value=0.005 mol/100 g)

$(Vi(Me)_2SiO_{0.5})_2(Me_2SiO)_{300}Z_{45}$ (A-9) Linear organosilicon compound of the formula below (Shin-Etsu Chemical Co., Ltd., Vi value=0.001 mol/100 g)

$(Vi(Me)_2SiO_{0.5})_2(Me_2SiO)_{1980}Z_{495}$ (B-1) Branched silicone of the formula below (Shin-Etsu Chemical Co., Ltd., Vi value=0.208 mol/100 g)

$(Vi(Me)_2SiO_{0.5})_{2.5}(PhSiO_{1.5})_{7.5}$ (B-2) Branched silicone of the formula below (Shin-Etsu Chemical Co., Ltd., Vi value=0.282 mol/100 g)

$(Vi(Me)_2SiO_{0.5})_{3.5}(Me_3SiO_{0.5})_{15}(SiO_2)_{45}$ (B-3) Linear silicone of the formula below (Shin-Etsu Chemical Co., Ltd., Vi value=0.047 mol/100 g)

$(Vi(Me)_2SiO_{0.5})_2(PhMeSiO)_{30}$ (B-4) Linear silicone of the formula below (Shin-Etsu Chemical Co., Ltd., Vi value=0.009 mol/100 g)

$(Vi(Me)_2SiO_{0.5})_2(Me_2SiO)_{300}$ (C-1) Linear silicone of the formula below (Shin-Etsu Chemical Co., Ltd., SiH value=0.602 mol/100 g)

$(H(Me)_2SiO_{0.5})_2(Ph_2SiO)_1$ (C-2) Branched silicone of the formula below (Shin-Etsu Chemical Co., Ltd., SiH value=0.602 mol/100 g)

$(H(Me)_2SiO_{0.5})_4(PhSiO_{1.5})_2$ (C-3) Linear silicone of the formula below (Shin-Etsu Chemical Co., Ltd., SiH value=1.556 mol/100 g)

$(Me_3SiO_{0.5})_2(MeHSiO)_{38}$ (D) Organosilicon compound of the formula below (Shin-Etsu Chemical Co., Ltd., SiH value=0.610 mol/100 g)

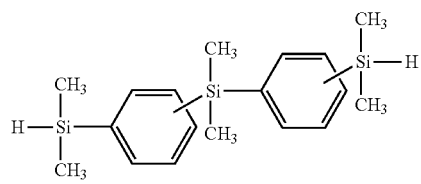

(F-1) Branched organosilicon compound of the formula below (Shin-Etsu Chemical Co., Ltd., Vi value=0.198 mol/100 g)

$(Vi(Me)_2SiO_{0.5})_3(PhSiO_{1.5})_7Y_{1.5}$ (F-2) Linear organosilicon compound of the formula below (Shin-Etsu Chemical Co., Ltd., Vi value=0.045 mol/100 g)

$(Vi(Me)_2SiO_{0.5})_2(PhMeSiO)_{28}Y_2$ (E) Chloroplatinic acid-divinyltetramethyldisiloxane complex (Shin-Etsu Chemical Co., Ltd., Pt content 2 wt %)

Examples 1 to 12 and Comparative Examples 1 to 3

Curable resin compositions were prepared by mixing the components exclusive of the catalyst (E) in the amounts shown in Tables 1 and 2, adding an amount of the catalyst (E) so as to give 2 ppm of platinum based on the total weight of the composition, and further mixing them. These resin compositions were examined by the following tests. In Tables 1 and 2, the value of H/Vi is a ratio of the total number of hydrosilyl groups to the total number of vinyl groups in the overall composition.

(1) Viscosity of Resin Composition

A viscosity at 23° C. of the curable resin composition was measured according to JIS Z 8803:2011 by a Brookfield viscometer.

(2) Hardness of Cured Product

The resin composition was cast into an aluminum dish of 50 mm diameter and 10 mm thick, and cured stepwise at 60° C. for 1 hour, at 100° C. for 1 hour, and at 150° C. for 4 hours into a cured product. The cured product was measured for Shore D or Durometer Type A hardness according to JIS K 6253-3:2012.

(3) Light Transmittance of Cured Product

A concave polytetrafluoroethylene spacer of 1 mm thick was sandwiched between two slide glass plates of 50 mm×20 mm×1 mm thick and fixedly secured. The resin composition was cast into the space, and cured stepwise at 60° C. for 1 hour, at 100° C. for 1 hour, and at 150° C. for 4 hours. The cured sample was measured for light transmittance at wavelength 450 nm on a spectrometer U-4100 (Hitachi High-Technologies Corp.).

(4) Heat Resistance

The sample in test (3) was allowed to stand at 150° C. for 1,000 hours before it was measured for light transmittance at 450 nm on spectrometer U-4100.

(5) Tensile Strength and Elongation at Break of Cured Product

The resin composition was cast into a concave polytetrafluoroethylene mold of 150 mm×200 mm×2 mm thick and cured stepwise at 60° C. for 1 hour, at 100° C. for 1 hour, and at 150° C. for 4 hours. The cured sample was measured for tensile strength and elongation at break on a tensile tester EZ TEST (EZ L by Ghimadzu Corp.) according Lu JIS K 6251:2010 under conditions including a separation rate of 500 mm/min, a distance between grips of 80 mm, and a distance between two gage marks of 40 mm.

(6) Thermal Cycling Test

The resin composition was dispensed on a package (Tiger 3528, Shin-Etsu Chemical Co., Ltd.) and cured stepwise at 60° C. for 1 hour, at 100° C. for 1 hour, and at 150° C. for 4 hours, obtaining a test sample in the form of the package encapsulated with the cured product. On twenty test samples, a thermal cycling test (TCT) between −50° C. and 140° C. was carried out over 1,000 cycles. The number of test samples in which the encapsulant cracked was counted.

The test results are shown in Tables 3 and 4.

TABLE 1

| Amount (pbw) | Example | | | | | | | |
|---|---|---|---|---|---|---|---|---|
| | 1 | 2 | 3 | 4 | 5 | 6 | 7 | 8 |
| (A-1) | 100 | 100 | 100 | 100 | 100 | 100 | | |
| (A-2) | | | | | | | 100 | |
| (A-3) | | | | | | | | 100 |
| (A-4) | | | | | | | | |
| (A-5) | | | | | | | | |
| (A-6) | | | | | | | | |
| (A-7) | 50 | 50 | 50 | 50 | | | | |
| (A-8) | | | | | | | | 450 |
| (A-9) | | | | | | | | |
| (B-1) | | | | | | | | |
| (B-2) | | | | | | | | |
| (B-3) | | | | | | 10 | 200 | |
| (B-4) | | | | | | | | 200 |
| (C-1) | 30 | | 28 | 16.5 | 28.5 | 30 | | |
| (C-2) | 2.5 | 2.5 | | | | 15 | | |
| (C-3) | | | | | | | 17.5 | 20 |
| (D) | | 35 | 1.5 | 16.5 | | | | |
| (F-1) | | | | | | | | |
| (F-2) | | | | | | | | |
| (E) | amount to give a Pt content of 2 ppm | | | | | | | |
| H/Vi | 1.01 | 1.17 | 0.90 | 1.01 | 0.94 | 1.09 | 1.18 | 1.78 |

TABLE 2

| Amount (pbw) | Example | | | | Comparative Example | | |
|---|---|---|---|---|---|---|---|
| | 9 | 10 | 11 | 12 | 1 | 2 | 3 |
| (A-1) | | | | | | | |
| (A-2) | | | | | | | |
| (A-3) | | | | | | | |
| (A-4) | 100 | | | | | | |
| (A-5) | | 100 | | | | | |
| (A-6) | | | 100 | | | | |
| (A-7) | | | | 100 | | | |

TABLE 2-continued

| Amount (pbw) | Example 9 | Example 10 | Example 11 | Example 12 | Comparative Example 1 | Comparative Example 2 | Comparative Example 3 |
|---|---|---|---|---|---|---|---|
| (A-8) | | | | | | | |
| (A-9) | 5 | | | | | | |
| (B-1) | | 500 | 500 | 50 | 100 | | |
| (B-2) | | | | | | 100 | |
| (B-3) | | | | 50 | | | |
| (B-4) | 200 | | | | | 200 | |
| (C-1) | | | | 10 | 36 | | 33.6 |
| (C-2) | | | | 4 | 3 | | 2.8 |
| (C-3) | 24 | | | | | 22.5 | |
| (D) | | 225 | 215 | | | | |
| (F-1) | | | | | | 100 | |
| (F-2) | | | | | | 50 | |
| (E) | amount to give a Pt content of 2 ppm | | | | | | |
| H/Vi | 2.90 | 0.97 | 0.98 | 0.62 | 1.03 | 1.17 | 1.01 |

TABLE 3

| Test results | | Example 1 | Example 2 | Example 3 | Example 4 | Example 5 | Example 6 | Example 7 | Example 8 |
|---|---|---|---|---|---|---|---|---|---|
| Viscosity (Pa · s) | 23° C. | 5.6 | 5.2 | 5.9 | 5 | 13.1 | 3.5 | 4.6 | 6.3 |
| Hardness | Shore D | 33 | 51 | 30 | 42 | 58 | — | — | — |
| | Type A | — | — | — | — | — | 75 | 88 | 41 |
| Light transmittance [1 mm thick, 450 nm] (% T) | Initial | 99.7 | 99.8 | 99.6 | 99.6 | 99.7 | 99.7 | 99.7 | 99.6 |
| | After 150° C./ 1,000 hr | 99.3 | 99.4 | 99.3 | 99.2 | 99.3 | 99.3 | 99.5 | 99.3 |
| Tensile strength (MPa) | 25° C. | 5.4 | 7.1 | 5 | 5.9 | 8.7 | 4 | 10.1 | 3.9 |
| Elongation at break (%) | 25° C. | 120 | 90 | 140 | 100 | 50 | 160 | 80 | 150 |
| TCT (number of cracked samples) | −50° C. ↔ 140° C. 1,000 cycles | 0/20 | 0/20 | 0/20 | 0/20 | 0/20 | 0/20 | 0/20 | 0/20 |

TABLE 4

| Test results | | Example 9 | Example 10 | Example 11 | Example 12 | Comparative Example 1 | Comparative Example 2 | Comparative Example 3 |
|---|---|---|---|---|---|---|---|---|
| Viscosity (Pa · s) | 23° C. | 4.5 | 1.8 | 2.8 | 4.8 | 3.6 | 6.2 | 4.2 |
| Hardness | Shore D | — | 64 | 68 | — | 24 | — | 28 |
| | Type A | 73 | — | — | 78 | — | 78 | — |
| Light transmittance [1 mm thick, 450 nm] (% T) | Initial | 99.6 | 99.7 | 99.8 | 99.7 | 99.7 | 99.6 | 99.8 |
| | After 150° C./ 1,000 hr | 99.4 | 99.1 | 99.2 | 99.3 | 99.2 | 99.3 | 99.3 |
| Tensile strength (MPa) | 25° C. | 8.2 | 7.2 | 8 | 4.4 | 3.2 | 8.1 | 3.9 |
| Elongation at break (%) | 25° C. | 120 | 70 | 60 | 160 | 60 | 50 | 80 |
| TCT (number of cracked samples) | −50° C. ↔ 140° C. 1,000 cycles | 0/20 | 0/20 | 0/20 | 0/20 | 18/20 | 20/20 | 10/20 |

It is evident from Tables 3 and 4 that the curable resin compositions containing a silphenylene oligomer skeleton-bearing organosilicon compound (Examples 1 to 12) cure into products which are hard, but have acceptable elongation and satisfactory mechanical strength, in contrast to the curable resin compositions consisting of organopolysiloxanes (Comparative Examples 1 and 2). The curable resin composition containing a silphenylene monomer skeleton-bearing organosilicon compound (Comparative Example 3) cures into a product which shows improvements in hardness and elongation, but is less effective in TCT, i.e., insufficient in crack resistance, as opposed to the curable resin compositions containing a silphenylene oligomer skeleton-bearing organosilicon compound. It has been demonstrated that the resin composition containing a silphenylene oligomer skeleton-bearing organosilicon compound endows the cured product with rigidity and toughness.

The addition curable resin composition containing a silphenylene oligomer skeleton-bearing organosilicon compound according to the invention cures into a product having satisfactory mechanical properties and heat resistance. By encapsulating a semiconductor chip with the cured resin composition, a fully reliable semiconductor package is obtained. Since the cured product has high light transmittance, the resin composition is best suited for the encapsulation of LED chips, especially blue and purple LED chips.

Japanese Patent Application No. 2015-249509 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An addition curable resin composition comprising a component (A) which is a silphenylene oligomer skeleton-bearing organosilicon compound having at least two alkenyl groups per molecule, represented by the general formula (1):

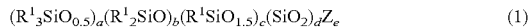

$$(R^1{}_3SiO_{0.5})_a(R^1{}_2SiO)_b(R^1SiO_{1.5})_c(SiO_2)_dZ_e \qquad (1)$$

wherein $R^1$ is independently a $C_1$-$C_{12}$ monovalent hydrocarbon group free of aliphatic unsaturation or $C_2$-$C_6$ alkenyl group, at least two of $R^1$ groups per molecule being alkenyl, Z is independently a group having the formula (2):

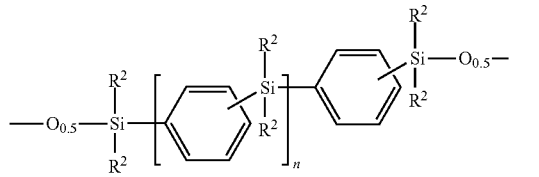

wherein $R^2$ is independently a $C_1$-$C_{12}$ monovalent hydrocarbon group, and n is an integer of 1 to 3, and a is an integer of 0 to 100, b is an integer of 0 to 5,000, c is an integer of 0 to 500, d is an integer of 0 to 500, e is an integer of 1 to 500, and $2 \leq a+b+c \leq 5,000$, wherein said component (A) comprises (A-i) a silphenylene oligomer skeleton-bearing branched organosilicon compound having at least two alkenyl groups per molecule, represented by formula (1) wherein b is an integer of 0 to 1,000, and $1 \leq c+d \leq 1,000$.

2. An addition curable resin composition comprising (A) a silphenylene oligomer skeleton-bearing organosilicon compound having at least two alkenyl groups per molecule, represented by the general formula (1):

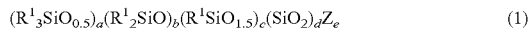

$$(R^1{}_3SiO_{0.5})_a(R^1{}_2SiO)_b(R^1SiO_{1.5})_c(SiO_2)_dZ_e \qquad (1)$$

wherein $R^1$ is independently a $C_1$-$C_{12}$ monovalent hydrocarbon group free of aliphatic unsaturation or $C_2$-$C_6$ alkenyl group, at least two of $R^1$ groups per molecule being alkenyl, Z is independently a group having the formula (2):

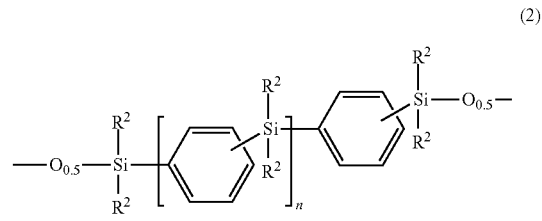

wherein $R^2$ is independently a $C_1$-$C_{12}$ monovalent hydrocarbon group, and n is an integer of 1 to 3, and a is an integer of 0 to 100, b is an integer of 0 to 5,000, c is an integer of 0 to 500, d is an integer of 0 to 500, e is an integer of 1 to 500, and $2 \leq a+b+c \leq 5,000$, wherein said component (A) comprises (A-ii) a silphenylene oligomer skeleton-bearing linear organosilicon compound having at least two alkenyl groups per molecule, represented by the general formula (3):

$$(R^1{}_3SiO_{0.5})_2(R^1{}_2SiO)_{b'}Z_{e'} \qquad (3)$$

wherein $R^1$ and Z are as defined above, at least two of $R^1$ groups per molecule being alkenyl, b' is an integer of 0 to 5,000, e' is an integer of 1 to 500, and $1 \leq b'+e' \leq 5,001$.

3. An addition curable resin composition comprising
(A) a silphenylene oligomer skeleton-bearing organosilicon compound having at least two alkenyl groups per molecule, represented by the general formula (1):

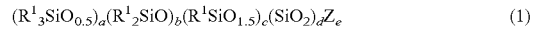

$$(R^1{}_3SiO_{0.5})_a(R^1{}_2SiO)_b(R^1SiO_{1.5})_c(SiO_2)_dZ_e \qquad (1)$$

wherein $R^1$ is independently a $C_1$-$C_{12}$ monovalent hydrocarbon group free of aliphatic unsaturation or $C_2$-$C_6$ alkenyl group, at least two of $R^1$ groups per molecule being alkenyl, Z is independently a group having the formula (2):

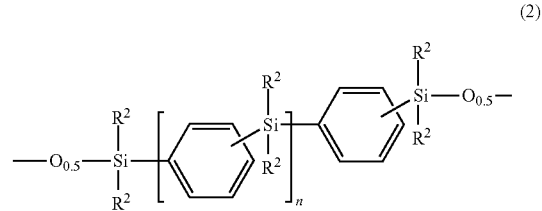

wherein $R^2$ is independently a $C_1$-$C_{12}$ monovalent hydrocarbon group, and n is an integer of 1 to 3, and a is an integer of 0 to 100, b is an integer of 0 to 5,000, c is an integer of 0 to 500, d is an integer of 0 to 500, e is an integer of 1 to 500, and $2 \leq a+b+c \leq 5,000$, and (B) an organopolysiloxane having at least two alkenyl groups per molecule, represented by the general formula (4):

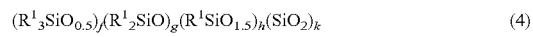

$$(R^1{}_3SiO_{0.5})_f(R^1{}_2SiO)_g(R^1SiO_{1.5})_h(SiO_2)_k \qquad (4)$$

wherein $R^1$ is as defined above, at least two of $R^1$ groups per molecule being alkenyl, f is an integer of 0 to 100, g is an integer of 0 to 5,000, h is an integer of 0 to 500, k is an integer of 0 to 500, and $2 \leq f+g+h \leq 5,000$, in an amount of 5 to 500 parts by weight per 100 parts by weight of the total weight of component (A) in the composition.

4. The composition of claim 3 wherein component (B) comprises (B-i) a branched organopolysiloxane having at least two alkenyl groups per molecule, represented by formula (4)

wherein
1≤h+k≤1,000, in an amount of 50 to 500 parts by weight per 100 parts by weight of the total weight of component (A) in the composition.

5. The composition of claim 3 wherein component (B) comprises (B-ii) a linear organopolysiloxane having at least two alkenyl groups per molecule, represented by the general formula (5):

   (5)

wherein
R$^1$ is as defined above, at least two of R$^1$ groups per molecule being alkenyl,
g' is an integer of 0 to 5,000,
in an amount of 5 to 200 parts by weight per 100 parts by weight of the total weight of component (A) in the composition.

6. An addition curable resin composition comprising
(A) a silphenylene oligomer skeleton-bearing organosilicon compound having at least two alkenyl groups per molecule, represented by the general formula (1):

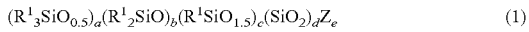   (1)

wherein R$^1$ is independently a C$_1$-C$_{12}$ monovalent hydrocarbon group free of aliphatic unsaturation or C$_2$-C$_6$ alkenyl group, at least two of R$^1$ groups per molecule being alkenyl, Z is independently a group having the formula (2):

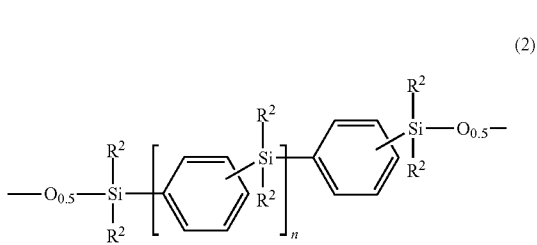   (2)

wherein R$^2$ is independently a C$_1$-C$_{12}$ monovalent hydrocarbon group, and n is an integer of 1 to 3, and a is an integer of 0 to 100, b is an integer of 0 to 5,000, c is an integer of 0 to 500, d is an integer of 0 to 500, e is an integer of 1 to 500, and 2≤a+b+c≤5,000,
optionally, (B) an organopolysiloxane having at least two alkenyl groups per molecule, represented by the general formula (4):

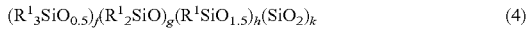   (4)

wherein R$^1$ is as defined above, at least two of R$^1$ groups per molecule being alkenyl, f is an integer of 0 to 100, g is an integer of 0 to 5,000, h is an integer of 0 to 500, k is an integer of 0 to 500, and 2≤f+g+h≤5,000,
(C) an organopolysiloxane having at least two hydrosilyl groups per molecule, represented by the general formula (6):

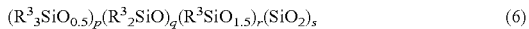   (6)

wherein R$^3$ is independently hydrogen or a C$_1$-C$_{12}$ monovalent hydrocarbon group, at least two of R$^3$ groups per molecule being hydrogen, and p is an integer of 0 to 100, q is an integer of 0 to 500, r is an integer of 0 to 300, s is an integer of 0 to 300, and 2≤p+q+r≤500, and/or
(D) a hydrosilyl-containing silphenylene compound represented by the general formula (7):

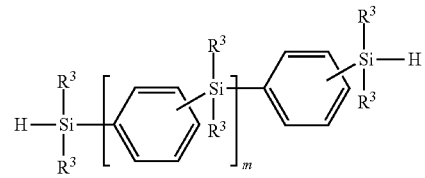   (7)

wherein R$^3$ is as defined above and m is an integer of 0 to 3,
in such amounts that a ratio of the total number of hydrosilyl groups in components (C) and (D) to the total number of alkenyl groups in component (A) and in component (B) if present ranges from 0.6/1 to 3/1.

7. An addition curable resin composition comprising
(A) a silphenylene oligomer skeleton-bearing organosilicon compound having at least two alkenyl groups per molecule, represented by the general formula (1):

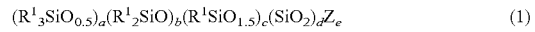   (1)

wherein R$^1$ is independently a C$_1$-C$_{12}$ monovalent hydrocarbon group free of aliphatic unsaturation or C$_2$-C$_6$ alkenyl group, at least two of R$^1$ groups per molecule being alkenyl, Z is independently a group having the formula (2):

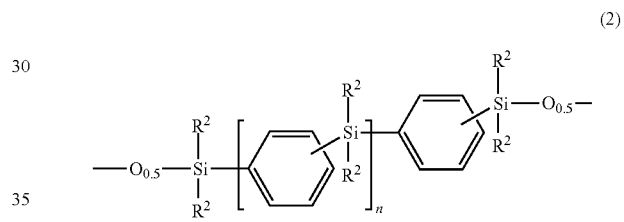   (2)

wherein R$^2$ is independently a C$_1$-C$_{12}$ monovalent hydrocarbon group, and n is an integer of 1 to 3, and a is an integer of 0 to 100, b is an integer of 0 to 5,000, c is an integer of 0 to 500, d is an integer of 0 to 500, e is an integer of 1 to 500, and 2≤a+b+c≤5,000, and
(E) a hydrosilylation catalyst.

8. A semiconductor package encapsulated with a cured product of an addition curable resin composition comprising a silphenylene oligomer skeleton-bearing organosilicon compound having at least two alkenyl groups per molecule, represented by the general formula (1):

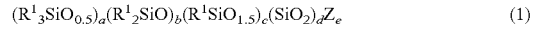   (1)

wherein R$^1$ is independently a C$_1$-C$_{12}$ monovalent hydrocarbon group free of aliphatic unsaturation or C$_2$-C$_6$ alkenyl group, at least two of R$^1$ groups per molecule being alkenyl, Z is independently a group having the formula (2):

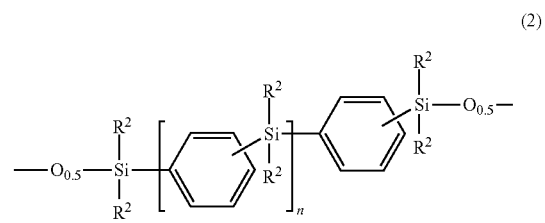   (2)

wherein R$^2$ is independently a C$_1$-C$_{12}$ monovalent hydrocarbon group, and n is an integer of 1 to 3, and a is an integer of 0 to 100, b is an integer of 0 to 5,000, c is an integer of 0 to 500, d is an integer of 0 to 500, e is an integer of 1 to 500, and $2 \leq a+b+c \leq 5,000$.

* * * * *